US011658570B2

(12) United States Patent
Krishnamurthy et al.

(10) Patent No.: US 11,658,570 B2
(45) Date of Patent: May 23, 2023

(54) SEAMLESS NON-LINEAR VOLTAGE REGULATION CONTROL TO LINEAR CONTROL APPARATUS AND METHOD

(71) Applicant: Intel Corporation, Santa Clara, CA (US)

(72) Inventors: Harish Krishnamurthy, Beaverton, OR (US); Sheldon Weng, Lake Oswego, OR (US); Nachiket Desai, Hillsboro, OR (US); Suhwan Kim, Portland, OR (US); Fabrice Paillet, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 178 days.

(21) Appl. No.: 17/009,661

(22) Filed: Sep. 1, 2020

(65) Prior Publication Data
US 2022/0069703 A1  Mar. 3, 2022

(51) Int. Cl.
| | |
|---|---|
| *G06F 1/00* | (2006.01) |
| *H02M 3/157* | (2006.01) |
| *G06F 1/26* | (2006.01) |
| *H02M 3/158* | (2006.01) |
| *H03H 17/02* | (2006.01) |

(52) U.S. Cl.
CPC ............. *H02M 3/157* (2013.01); *G06F 1/26* (2013.01); *H02M 3/1584* (2013.01); *H03H 17/0211* (2013.01)

(58) Field of Classification Search
CPC .. H02M 3/157; H02M 3/1584; H02M 1/0025; G06F 1/26; H03H 17/0211
See application file for complete search history.

(56) References Cited

U.S. PATENT DOCUMENTS

| | | | | |
|---|---|---|---|---|
| 7,622,820 | B1* | 11/2009 | Prodic | H02M 3/158 |
| | | | | 361/689 |
| 8,330,529 | B1* | 12/2012 | Zhang | G05F 1/575 |
| | | | | 324/416 |
| 9,684,325 | B1* | 6/2017 | Rasmus | G05F 1/575 |
| 2003/0081389 | A1* | 5/2003 | Nair | H01L 25/16 |
| | | | | 361/764 |
| 2005/0242791 | A1* | 11/2005 | Rajapandian | G05F 1/46 |
| | | | | 323/268 |
| 2007/0013350 | A1* | 1/2007 | Tang | H02M 3/1584 |
| | | | | 323/237 |

(Continued)

*Primary Examiner* — Xuxing Chen
(74) *Attorney, Agent, or Firm* — Schwabe, Williamson & Wyatt, P.C.

(57) ABSTRACT

A digital control scheme controls an integrator of a PID filter to implement non-linear control of saturating the duty cycle during which the proportional and derivative terms of the PID filter are set to 0 while the integrator and its internal states (previous values or memory) is set to a duty cycle that is the sum of the current nominal duty cycle plus a deltaD. The deltaD is the maximum duty cycle increment that is used to regulate a voltage regulator from ICCmin to ICCmax and is a configuration register that can be set post silicon. An FSM moves from a non-linear all ON state to an open loop duty cycle which maintains the output voltage slightly higher than the required Vref. After a certain period in this open loop, the FSM then ramps down the open loop duty cycle value until the output voltage is close to the Vref.

20 Claims, 6 Drawing Sheets

(56) References Cited

U.S. PATENT DOCUMENTS

| | | | | |
|---|---|---|---|---|
| 2007/0035284 A1* | 2/2007 | Schoofs | H02M 3/1584 | |
| | | | 323/283 | |
| 2007/0210777 A1* | 9/2007 | Cervera | H02M 3/157 | |
| | | | 323/284 | |
| 2008/0157740 A1* | 7/2008 | Gurcan | G05F 1/565 | |
| | | | 323/283 | |
| 2008/0174289 A1* | 7/2008 | Gurcan | G05F 1/575 | |
| | | | 323/280 | |
| 2012/0319478 A1* | 12/2012 | Gentchev | H02M 1/14 | |
| | | | 323/361 | |
| 2013/0223565 A1* | 8/2013 | McCallister | H04L 25/03343 | |
| | | | 375/297 | |
| 2013/0249505 A1* | 9/2013 | Brown | H02M 3/156 | |
| | | | 323/223 | |
| 2014/0333270 A1* | 11/2014 | Young | G05F 1/12 | |
| | | | 323/234 | |
| 2015/0222183 A1* | 8/2015 | Karlsson | H02M 3/156 | |
| | | | 323/271 | |
| 2016/0118887 A1* | 4/2016 | Zhang | H02M 3/158 | |
| | | | 323/271 | |
| 2016/0179181 A1* | 6/2016 | Doyle | G06F 1/3287 | |
| | | | 713/323 | |
| 2018/0292851 A1* | 10/2018 | Mahajan | G05F 1/575 | |
| 2019/0212704 A1* | 7/2019 | Mahajan | G05F 1/561 | |
| 2020/0142436 A1* | 5/2020 | Chang | G05F 1/618 | |
| 2021/0149422 A1* | 5/2021 | Perez | G05F 1/575 | |

* cited by examiner

US 11,658,570 B2

SEAMLESS NON-LINEAR VOLTAGE REGULATION CONTROL TO LINEAR CONTROL APPARATUS AND METHOD

BACKGROUND

The rate of change of current (di/dt) has only been increasing in today's modern processors and system-on-chips (SoCs). The amount of decoupling capacitance on an output supply node is unable to cope with the increasing di/dt (change in current over time) on the output supply node and one of the major guardbands added to every voltage regulator is the droop guardband. Integrated voltage regulators (IVRs) like fully-integrated voltage regulator (FIVR) employ non-linear clamps (NLC) to minimize the impact of voltage droop on the output supply node. The architecture of NLC involves a non-linear action to maximize duty cycle (e.g., 100%) of a pulse train for short durations to charge the output supply node quickly while allowing the traditional linear control to then take over and ensure that the output voltage settles eventually. The non-linear controller bandwidth is typically of the order of a few hundred MHz (determined by loop delay) while the linear bandwidth could be a few tens of MHz. This discrepancy of the two control loop bandwidths can cause the output voltage on the output supply node to chatter, resulting in multiple actions of NLC to allow the linear controller to increase its duty cycle and eventually take and prevent further non-linear controller action. Here, chatter refers to oscillation-like noise (current and/or voltage) on a node.

The output voltage chatter on the output supply node, however, does not help the integrator in the proportional-integral-derivative (PID) Type-III controller because the error voltage (difference between the output voltage and a reference) is being changed so frequently resulting in a longer duration of chatter. Furthermore, the fall in the output voltage is a function of the duty cycle of the pulse train which determines the current in the inductors of the voltage regulator, the output decoupling capacitance, and the amount of load current. This chatter may result in the voltage droop being lower than the first time the NLC is fired (or enabled) which may cause a Vmin degradation. Here, Vmin refers to the minimum operating voltage below which logic circuits of a processor do not function properly and reliably. This chatter causes an immense amount of variability on the voltage droop and thereby makes Vmin indeterministic. An indeterministic Vmin eventually necessitates adding a larger guardband to ensure that the design does not go below that Vmin value and that the guardband becomes a trial and error play in high volume manufacturing (HVM) and validation than being a number provided by the intellectual property (IP) specification.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
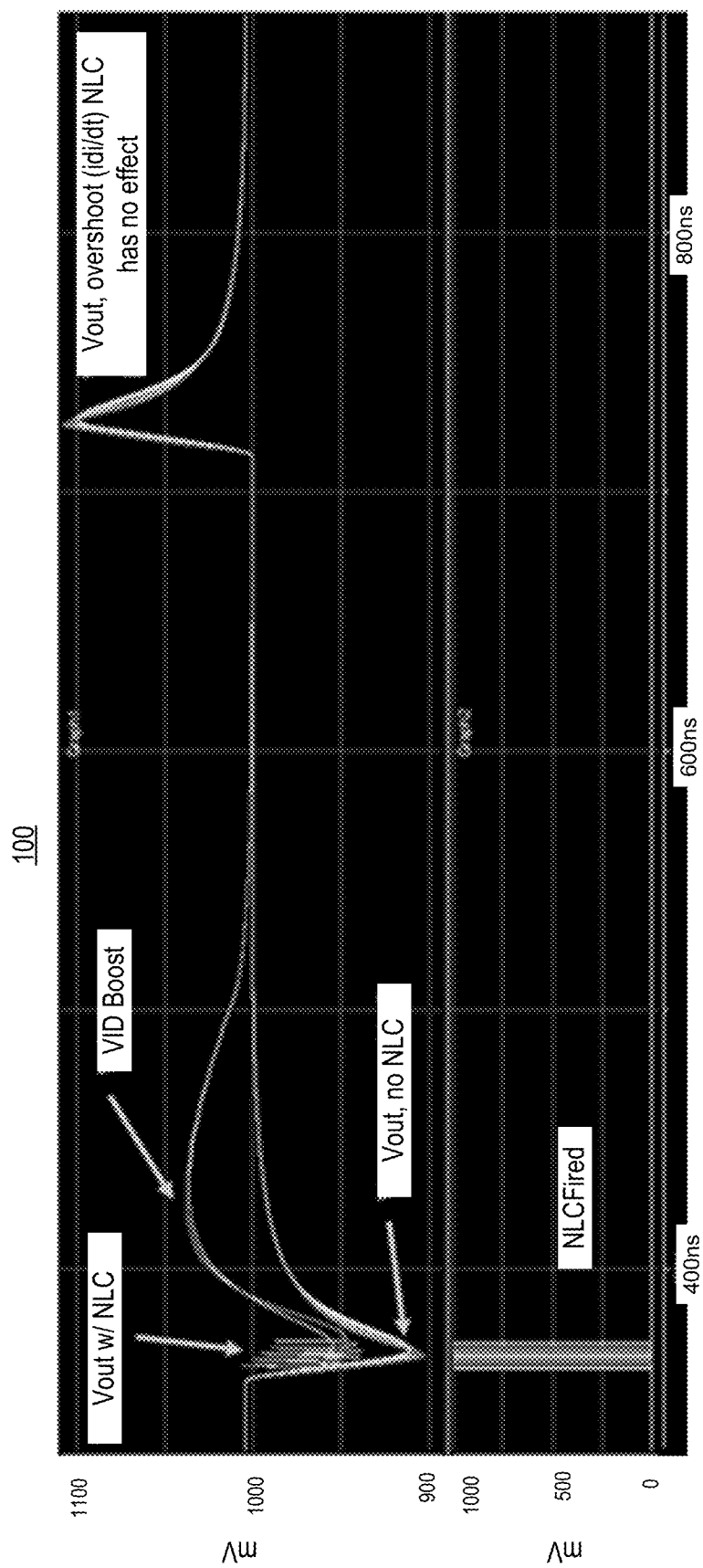
FIG. 1 illustrates a set of plots showing operation of the NLC demonstrating chatter on the output voltage while the NLC is firing.
Figure 1:
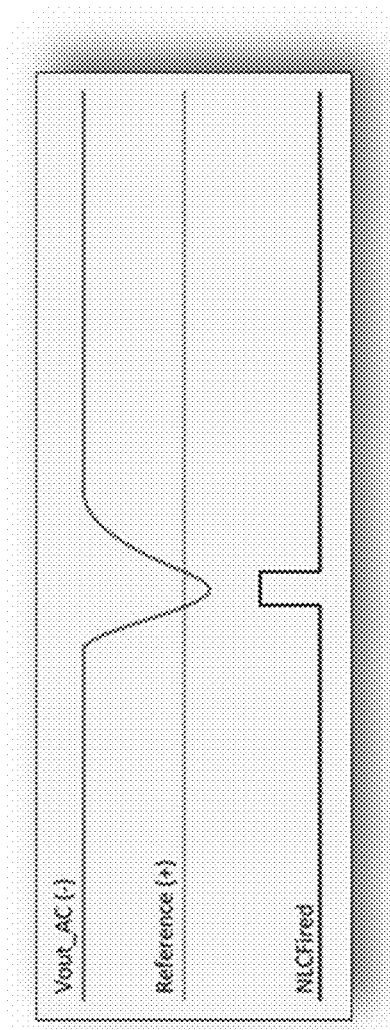

FIG. 1 illustrates a set of plots 100 showing operation of a Non-Linear Clamp (NLC) demonstrating chatter on the output voltage while the NLC is firing. When the voltage on the power supply node Vout experiences a droop below a reference threshold (a droop threshold), an NLC logic generates a pulse (herein referred to as NLCFired pulse) which turns on the NLC to mitigate the effects of the droop. The NLC may comprise a high-side switch and a low-side switch coupled in series with the high-side switch, and where both switches are coupled to the output supply node (directly or via an inductor). When the NLCFired pulse turns on, the high-side switch of the NLC turns for a duration determined by a pulse width of the NLCFired pulse. The NLCFired pulse remains high as long as the output voltage Vout is below the set threshold.

A voltage regulator may include a linear feedback control path where duty cycle of a pulse width modulated wave is adjusted to control the current injected by a bridge into the power supply node Vout. In the linear feedback control path, the output voltage Vout is monitored against a reference (a typical reference to regulate Vout) and the duty cycle of the pulse width modulated wave is adjusted accordingly. The voltage regulator also includes a secondary feedback control path which includes the NLC. When the NLCFired pulse is generated, the duty cycle of the pulse width modulated wave is increased to provide an increased current to the power supply node Vout to mitigate the droop on the output voltage Vout. The secondary feedback control path has a bandwidth which is higher than a bandwidth of the linear feedback control path. The higher bandwidth is used for faster response of the NLC to mitigate the droop and get back to the normal linear feedback control path. This discrepancy of the two control loop bandwidths can cause the output voltage and/or current to chatter (e.g., to toggle), resulting in multiple actions of NLC to allow the linear controller to increase its duty cycle and eventually take and prevent further non-linear controller action, as shown in FIG. 1.

The output voltage chatter on the output supply node Vout, however, does not help the integrator in the PID/Type-III controller because the error voltage is being changed so frequently resulting in a longer duration of chatter. Furthermore, the fall in the output voltage is a function of the duty cycle which determines the current in the inductors, the output decoupling and the amount of load current. Sometimes this chatter may result in the voltage droop being lower than the first time the NLC fired which may cause a Vmin degradation as seen in FIG. 1, where the $4^{th}$ or $5^{th}$ chatter's Vmin is lower than the first thereby undoing the effect of setting the threshold which is no longer reflective of the Vmin that can be guaranteed. This causes an immense amount of variability on the droop and thereby a variability in deterministic Vmin. Here, Vmin refers to a voltage level of Vout below which the logic circuit powered by Vout does not function properly.

In some examples, the NLC may be implemented as a simple push-pull based linear regulator equivalent with a parasitic inductance to slow down the slew rate of output charge. A VID (voltage-identification boost feature) may be added to prevent the NLC feature from taking over the output regulation from the linear controller. A power management unit (PMU) may predict an extent of load on the output supply node Vout and set an appropriate VID boost. However, the VID boost feature is complex and challenging to get right all the time.

The output chatter on Vout leads to Vmin degradation due to finite bandwidth and delays in the loop. This leads to non-deterministic droop for the same workload which could result in an inflated guardband for the droop. This chatter may cause bits to flip in sensitive register file areas which could cause a malfunctioning processor. VID boost requirement and its dependency on the PMU makes the success of the technique depend on accurate indication of the current load step anticipated. Analog control in general has poor scalability and portability and in today's day and age of needing the IP on several nodes to stay competitive in all market segments.

Various embodiments use a digital control scheme to manage states of the proportional-integral-derivative (PID) Type-III controller (or PID filter). The digital control scheme controls the integrator of the PID filter to implement non-linear control of saturating the duty cycle during which the proportional and derivative terms of the PID are set to 0 while the integrator and its internal states (previous values or memory) are set to a duty cycle that is the sum of the current nominal duty cycle (Dnom) plus a deltaD. The deltaD is the maximum duty cycle increment that is used to regulate the voltage regulator from ICCmin to ICCmax and is a configuration register that can be set post silicon. Here, ICCmin refers to the minimum current drawn by the load (e.g., when the load is in low power mode) while ICCmax refers to the maximum current drawn by the load (e.g., when the load is in high power mode such as Turbo mode).

Some embodiments use a state machine that moves from a non-linear all ON state (which brings the output voltage Vout back to a regulation window) to an open loop duty cycle (applying Dnom+deltaD) which maintains the output voltage slightly higher than the required reference voltage Vref. After a certain period in this state of open loop at the commanded duty cycle, the state machine ramps down the open loop duty cycle value until the output voltage is close to the Vref commanded. When the error voltage (difference between Vout and Vref) as detected from an output voltage of an analog-to-digital converter (ADC) is close to 0, the voltage regulator enters back into closed loop and re-enables the proportional and derivative term of the PID.

In some embodiments, a voltage regulator is provided which comprises a low bandwidth feedback path to control regulation of an output supply voltage relative to a first reference voltage during a steady state. In some embodiments, the voltage regulator comprises a high bandwidth feedback path to control regulation of the output supply voltage when the output supply voltage crosses a second threshold, wherein the second threshold is lower than the first threshold. In some embodiments, the voltage controller comprises a controller to facilitate transition from the high bandwidth feedback path to the low bandwidth feedback path via a multiplexer to bypass a feedforward path of the controller. In some embodiments, the controller is a first controller, wherein the controller receives a digital representation of an error between the output supply voltage and the first reference, and to generate a duty cycle command. The duty cycle command instructs a second controller to adjust a duty cycle of a signal which is used to adjust the output supply voltage. The voltage regulator comprises a register to store an offset to be added to the duty cycle command, wherein the offset is added to the duty cycle before the output supply voltage crosses the second threshold. The offset is used to extend the duty cycle of the signal that controls the switches which in turn control the amount of current provided to the output supply node. As the offset is increases, the duty cycle increases which in turn raises the output supply voltage because more current is provided to the output supply node.

In some embodiments, the voltage regulator comprises a counter to lower the offset as the error between the analog voltage and the first threshold reduces. In some embodiments, the voltage regulator comprises logic to allow an output of the feedforward path to pass through the multiplexer to an integral path of the first controller when the offset is close to zero. In some embodiments, the voltage regulator comprises logic to allow an output of the feedforward path to pass through the multiplexer to an integral path of the first controller when the error between the output supply voltage and the first threshold is substantially zero. In some embodiments, the low bandwidth feedback path and the high bandwidth feedback path comprise a bridge having a high-side switch and a low-side switch, wherein the high-side switch and the low-side switch are controllable by a first signal and a second signal, wherein the first and second signals have a duty cycle adjusted according to the duty cycle command. In this case, both the low bandwidth feedback path and the high bandwidth feedback path share the same bridge(s). At any given time, one of the low bandwidth feedback path and the high bandwidth feedback path is enabled, in accordance with some embodiments.

There are many technical effects of the various embodiments. For example, the output chatter on the output supply node is completely eliminated (or substantially eliminated) and there is merely a single undershoot transition which could lead to a guaranteed Vmin based on a comparator delay (or ADC delay) and the di/dt of the load with the available output decoupling capacitance. The output decoupling capacitance is the capacitance between output supply node Vout and ground. The elimination of chatter leads to a deterministic droop for the same workload which could result in a precise guardband for the voltage droop. Since the technique of the various embodiments eliminates chatter from the output voltage there is also no real risk of inductive coupling onto sensitive circuits such as, register file areas, allowing the processor to enable droop reduction techniques without any perceived risk in the field.

The technique of various embodiments, provides a deterministic and finite droop and therefore simplifies High-Volume Manufacturing (HVM) and validation to set the correct Vref threshold to minimize droop guardband. In some embodiments, VID boost feature may not be needed and therefore, the technique described herein is independent of a digital-to-analog converter (DAC) speed or PMU interface speed making the technique much more robust and impactful in handling multiple di/dt events close to each other. The technique of various embodiments is digital which relies on a comparator to detect the droop making this the technique scalable and portable to multiple process generations and facilitates maximum reuse improving the time to market significantly. The technique of various embodiments improves settling time of the voltage regulator and therefore, improves state transitions time and improves power.

The technique of various embodiments decouples the need for having a higher linear bandwidth for the digital controller as the output waveform is repeatable and reproducible which facilitates optimizing the controller design for area and power and ensuring bandwidth is larger than the VID transition ramp rate (which at the maximum can be of 2V/µs, for example). The technique of various embodiments saves tremendous amount of quiescent power overheads and also minimizes area overhead for the digital controller allowing the overall size of the IP (intellectual property) block to shrink. Other technical effects will be evident from the various figures and embodiments.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e g, immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "analog signal" is any continuous signal for which the time varying feature (variable) of the signal is a representation of some other time varying quantity, i.e., analogous to another time varying signal.

The term "digital signal" is a physical signal that is a representation of a sequence of discrete values (a quantified discrete-time signal), for example of an arbitrary bit stream, or of a digitized (sampled and analog-to-digital converted) analog signal.

The term "scaling" generally refers to converting a design (schematic and layout) from one process technology to another process technology and may be subsequently being reduced in layout area. In some cases, scaling also refers to upsizing a design from one process technology to another process technology and may be subsequently increasing layout area. The term "scaling" generally also refers to downsizing or upsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right." "front," "back," "top," "bottom," "over," "under," and the like in the description and in the claims, if any, are used for descriptive purposes and not necessarily for describing permanent relative positions.

It is pointed out that those elements of the figures having the same reference numbers (or names) as the elements of any other figure can operate or function in any manner similar to that described but are not limited to such.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

Figure 2:
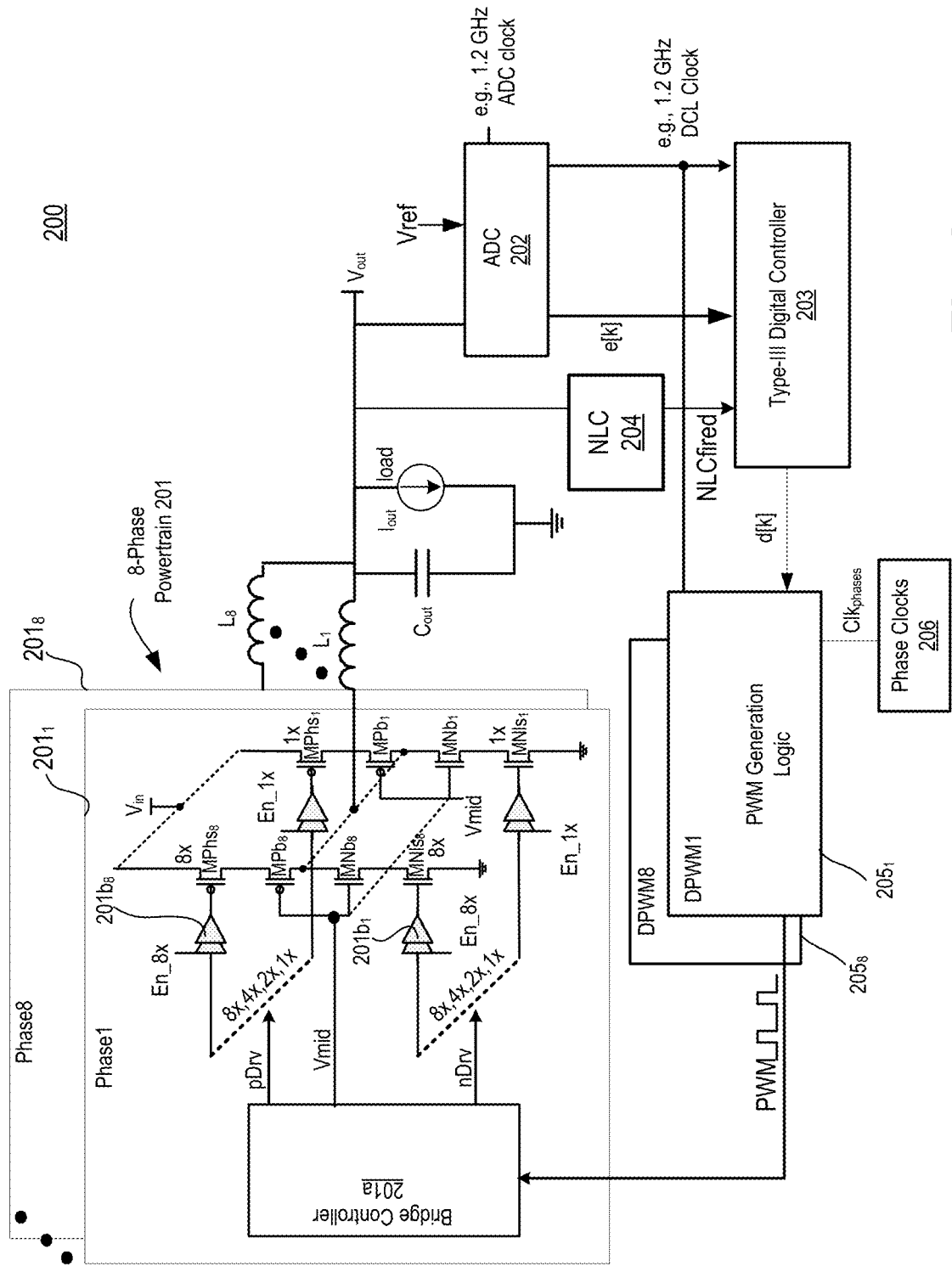
FIG. 2 illustrates a voltage regulator with apparatus for seamless transition from non-linear control to linear regulation mode, in accordance with some embodiments.

FIG. 2 illustrates voltage regulator (VR) 200 with apparatus for seamless transition from non-linear control to linear regulation mode, in accordance with some embodiments. VR 200 (also referred to as an integrated VR (IVR)) comprises a plurality of phases (e.g., Phase 1 to Phase 8) $201_{1-8}$ coupled to corresponding inductors $L_1$ though $L_8$, output capacitance Cout, analog-to-digital converter (ADC) 202, Type-III Digital Controller or filter 203, NLC logic 204, pulse width modulation (PWM) generation logic 205 (e.g., 2051-8), and phase clock generator 206. VR 200 is a simplified version of voltage regulator. A person skilled in the art would appreciate that the regulator may include over-current protection logic, current sensors, digital-to-analog converters (DACs), delay locked loops (DLL), clamp bridge independent of the plurality of phases, etc.

In some embodiments, each phase (e.g. $201_1$) includes a plurality of bridges. The bridges may be thermometer weighted or binary weighted (as shown). In some embodiments, each phase includes a high-side switch MPhs (e.g., binary weighted $MPhs_1$ through $MPhs_8$) and a low-side switch MNls (e.g., binary weighted $MNls_1$ through $MNls_8$). In some embodiments, the high-side switch MPhs is directly coupled to the low-side switch MNls. The common node coupling the high-side switch MPhs and the low-side switch MNls is coupled to an inductor (e.g., inductor $L_1$ for phase 1 $201_1$).

In some embodiments, bias transistors MPb and MNb are coupled between the high-side switch MPhs and the low-side switch MNls. For example, bias transistors $MPb_1$ through $MPb_8$ are coupled to the high-side switches $MPhs_1$ through $MPhs_8$, respectively, and bias transistors $MNb_1$ through $MNb_8$ are coupled to low-side switches $MNhs_1$ through $MNhs_8$, respectively as shown. The bias transistors MPb and MNb may be controlled by a bias voltage such as Vmid (e.g., Vin/2). In various embodiments, the high-side switches and the low-side switches are driven by their respective drivers (e.g., $201b_1$ through $201b_8$) which are sized according to the switches they drive. The high-side switches are driven by pDrv while the low-side switches are driven by nDrv. pDrv and nDrv are generated by bridge controller $201a$. In various embodiments, pDrv and nDrv are complementary to each other. The duty cycle of pDrv and nDrv is adjusted to change the current sourced and sunk from Cout via the respectively inductors.

Here, load is represented by a current source. The load can be any suitable load such as a processor, processor core, a logic domain within a processor or processor core. ADC 202 monitors the output voltage Vout (or a divided version of Vout) against a reference Vref and generates a digital representation e(k) of a difference between Vout and Vref. This difference is an error term. ADC 202 is an apparatus that converts a continuous physical quantity (e.g., voltage) to a corresponding digital number that represents the amplitude of the physical quantity. ADC 202 may comprise a comparator with one input coupled to Vref and another input coupled to Vout or a divided version of Vout. The output of the comparator is e[k]. The Type-III digital controller 203 is a linear digital compensator (Linear) or PID filter which takes the voltage error e[k] as an input and outputs a duty cycle command d[k] to the Digital PWM (DPWM) block(s) ($205_1$ through $205_8$) for each of the active phases. The duty cycle command d[k] controls the duty cycle of a pulse width modulated wave which controls the pDrv and nDrv.

In various embodiments, Type-III digital controller 203 exploits digital control and its ability to control states of the PID filter, especially the integrator of the PID filter. In some embodiments, Type-III digital controller 203 implements non-linear control of saturating the duty cycle of pDrv and/or nDrv during which the proportional and derivative terms of the PID are set to 0 while the integrator and its internal states (previous values or memory) is set to a duty cycle that is the sum of the current nominal duty cycle (Dnom) plus a deltaD. The deltaD is the maximum duty cycle increment that is needed to regulate IVR 200 from ICCmin to ICCmax.

In some embodiments, deltaD is stored in a configuration register that can be set post silicon. In some embodiments, deltaD is a programmable number that be modified by software (e.g., firmware) or hardware (e.g., configuration register). The Type-III digital controller 203 uses the output (NLCfired) of NLC 204 to determine when to implement non-linear control of saturating the duty cycle command d[k] which in turn saturates the duty cycle of the PWM wave generated by PWM generation logic 205 (e.g., $205_1$ through $205_8$). In some embodiments, NLC logic 204 includes a comparator that compares the output voltage Vout with a certain set threshold (a droop threshold). When Vout crosses this threshold (e.g., goes below the threshold), NLC logic 204 sets an NLCfired signal and this signal remains high as long as the output voltage is below the set threshold.

In some embodiments, a finite state machine (FSM) or any suitable logic is provided which controls Type-III digital controller 203. The FSM moves from a non-linear all ON state (to bring output voltage back to regulation window) to an open loop duty cycle state (Dnom+deltaD) which maintains the output voltage Vout slightly higher than the required Vref. Here, the "all ON" state refers to turning on all bridges or powertrain 201. After a certain period in the open loop duty cycle state at the commanded duty cycle, the FSM ramps down the open loop duty cycle value d[k] until the output voltage Vout is close to the Vref commanded (e.g., the Vref used by ADC 202). When the error voltage e[k] as detected from the output voltage ADC 202 is close to 0, regulator 200 enters back into closed loop and re-enables the proportional and derivative term of the PID controller 203, in accordance with some embodiments.

In some embodiments, PWM generator logic 205 (e.g., $205_1$ through $205_8$). In some embodiments, PWM generator logic 205 comprises a triangular (or other waveform) wave generator which generates a periodic triangular wave. The triangular wave is input to a comparator. Another input of the comparator is coupled to a threshold voltage. In some embodiments, the threshold voltage is adjusted (e.g., raised or lowered) to change a duty cycle of the output of the comparator. In some embodiments, duty cycle command d[k] provides the adjustment to the threshold voltage of PWM generator logic 205 to realize the change in duty cycle at the output of the comparator of PWM generator logic 205. The output of PWM generator logic 205 is a PWM wave which is then converted to pDrv and nDrv signals by bridge controller $201a$. Bridge controller $201a$ includes an FSM to decide how many phases to enable based on the loading condition on the output supply node Vout. For example, bridge controller $201a$ determines the number of bridges in a phase to activate or deactivate. Here, node names and signal names are interchangeably used. For example, Vout may refer to the output supply node Vout or the output supply voltage Vout depending on the contend of the sentence. In some embodiments, the comparator of PWM generation logic 205 is a clocked comparator which samples the output of the comparator by clocks of one or more phases $Clk_{phases}$ generated by phase clock generator 206.

While the various embodiments here are illustrated with reference to eight bridges per phase, eight phases, eight inductors, and eight PWM generation logic, any number of bridges per phase, phases, inductors, and PWM generation logic may be used.

Figure 3:
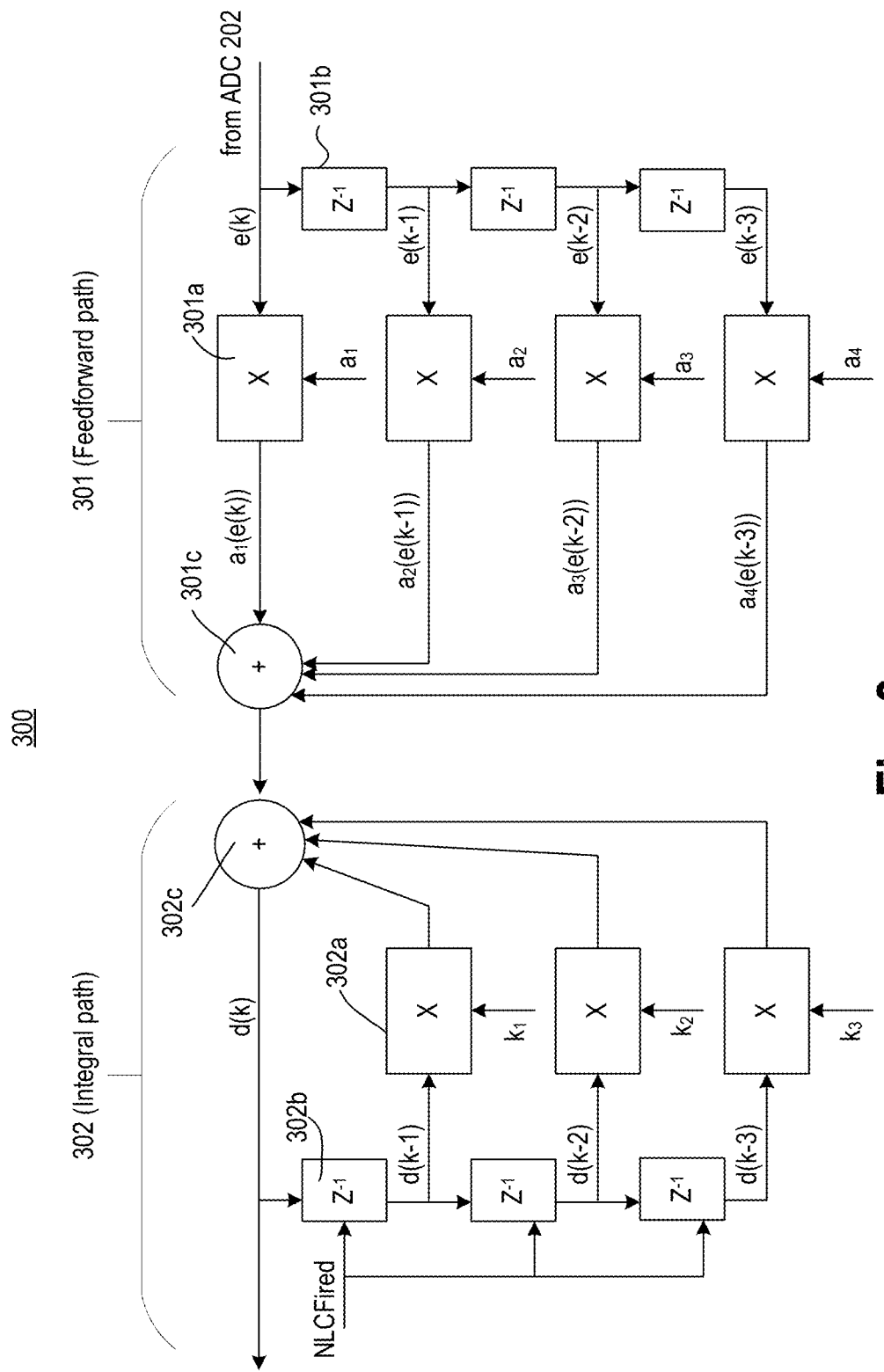
FIG. 3 illustrates a classic Type-III digital controller.

FIG. 3 illustrates a classic Type-III digital controller 300 which includes a feedforward (FF) path 301 and an integral path 302. The FF path 301 includes multipliers $301a$, delay units $301b$, and an adder $301c$ (or summation node) coupled as shown. The integral path 302 comprises multipliers $302a$, delay units $302b$, and integrator $302c$ (or summation node).

The linear digital compensator 300 takes the error voltage e[k] as an input and outputs a duty cycle command d[k] to the Digital PWM (DPWM) block(s) $205_1$ through $205_8$ for each of the active phases. The linear compensator is implemented with difference equations. FIG. 3 shows a typical Type-III controller that implements an integrator, to guarantee zero steady state error, two complex/real zeros to eliminate the complex LC poles of the buck converter and another two poles placed approximately at the output at ESR (equivalent series resistance) zero frequency or approximately LC poles times 5, to ensure quicker roll off at higher frequency minimizing any sensitivity to high frequency noise. The difference equation is implemented in RTL (hardware description language) and written as follows:

$$d(k)=a_1e(k)+a_2e(k-1)+a_3e(k-2)+a_4e(k-3)+k_1d(k-1)+k_2d(k-2)+k_3d(k-3) \quad (1)$$

The multiplication factors $a_1$, $a_2$, $a_3$ and $a_4$ and $k_1$, $k_2$, and $k_3$ are implemented using multipliers, and are configured using registers. All data is updated with every new output voltage sample at a sampling frequency which could be anywhere between 1× and 8× depending upon the bandwidth vs area/power requirements.

Figure 4:
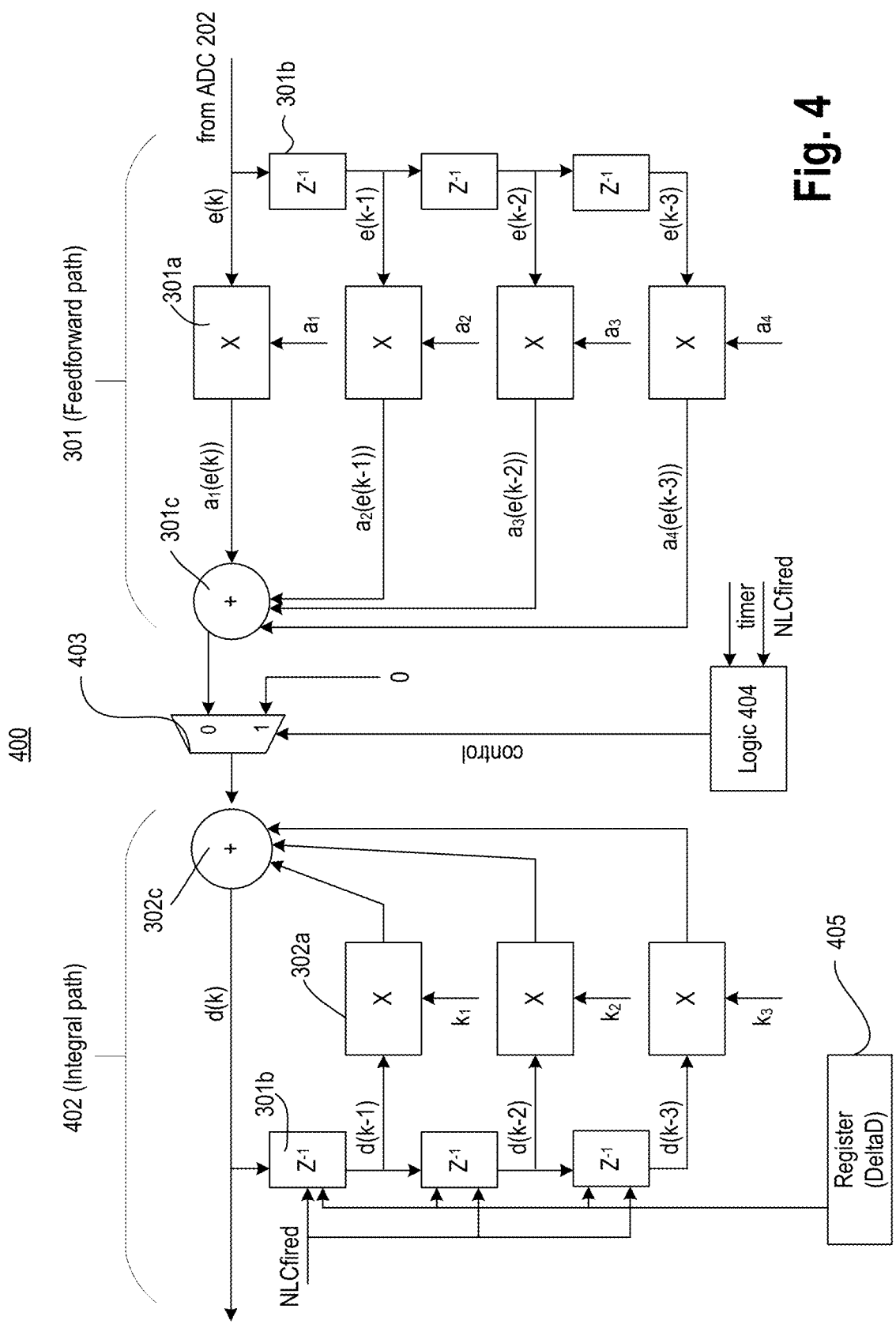
FIG. 4 illustrates a modified Type-III digital controller to facilitate seamless transition from non-linear control to linear regulation mode, in accordance with some embodiments.

FIG. 4 illustrates a modified Type-III digital controller 400 (e.g., filter 203) to facilitate seamless transition from non-linear control to linear regulation mode, in accordance with some embodiments. Compared to Type-III digital controller 300, a multiplexer 403 is provided between the FF path 301 and integral path 402. In some embodiments, multiplexer 403 is controlled by control signal generated by logic 404. Logic 404 may include combinational gates and/or sequential units (e.g., flip-flops, latches, etc.) that receive NLCfired and timer signals to determine the logic value of the control. In some embodiments, logic 404 is implemented by an FSM. The integral path 402 is further controlled by DeltaD and Dnom values from register 405. Here, DeltaD indicates an offset intended to be added to the duty cycle terms (d(k), d(k−1), d(k−2)) while Dmon indicates the nominal duty cycle terms d(k), d(k−1), d(k−2), d(k−3) without artificial offset added to or subtracted from.

Modified Type-III digital controller 400 facilitates seamless transitions from non-linear to linear modes without any output voltage chatter on Vout. When a comparator with a set threshold (e.g., droop threshold) in NLC Logic 204 triggers the NLCfired signal (e.g., because of a voltage droop on Vout), logic 404 generates a control which bypasses the error terms e(k) via multiplexer 403 and replaces with 0. For example, when NLCfired is asserted as shown in FIG. 1, logic 404 asserts the control signal which selects the predetermined value (e.g., 0) as the output of multiplexer 403. At the same time, content of register 405 that stores the DeltaD value is added to the sampled Dnom prior to the NLCfired signal going high, and is fed into the initial state of the d(k−1), d(k−2), and d(k−3) terms.

The resulting duty cycle command d(k) is therefore equal to Dnom+DeltaD as the sum of $k_1$, $k_2$, and $k_3$ is equal to 1 which is needed for an infinite DC gain integrator. As such, Type-III compensator 400 is handheld to output the value of the duty cycle needed while setting the integrator states correctly, which will avoid any wind-up or other classical mechanisms that cause output chatter.

The next phase of the FSM is to hold controller 400 at this above state for a configurable number of clock cycles after which the value Dnom+DeltaD is lowered step-by-step to lower the output voltage to bring it closer to its nominal output voltage. In some embodiments, after the NLCfired is de-asserted and after a configurable number of clock cycles as indicated by the timer signal, logic 404 generates the control signal that selects the output of summing node 301c. In some embodiments, when the output voltage Vout is around (or close to) the reference value Vref, as detected by observing e(k), the integrator value is stopped from decrementing and the proportional and derivative values are sent through normally to execute the Type-III equation (1).

At the e(k) value of 0, the contribution of the error terms is 0 as e(k−1), e(k−2) and e(k−3) were previously 0 and e(k) is also 0. In this case, equation (1) can be expressed as:

$$d(k)=k_1d(k-1)+k_2d(k-2)+k_3d(k-3) \quad (2)$$

Further, since the integrator output was the value of the d(k) which resulted in e(k) being 0 also results in duty cycle remaining the same which thereby eliminates chatter from the output waveform and the controller continues to then regulate as programmed for its bandwidth and phase margin. This state machine not only eliminates chatter from the output voltage waveform Vout when transitioning from non-linear to linear mode but also decouples the need for having a higher bandwidth for the digital controller in its linear mode which could then be optimized for area and power. In one example, results of this technique demonstrate about 70% improvement in droop over traditional linear controller.

Figure 5:
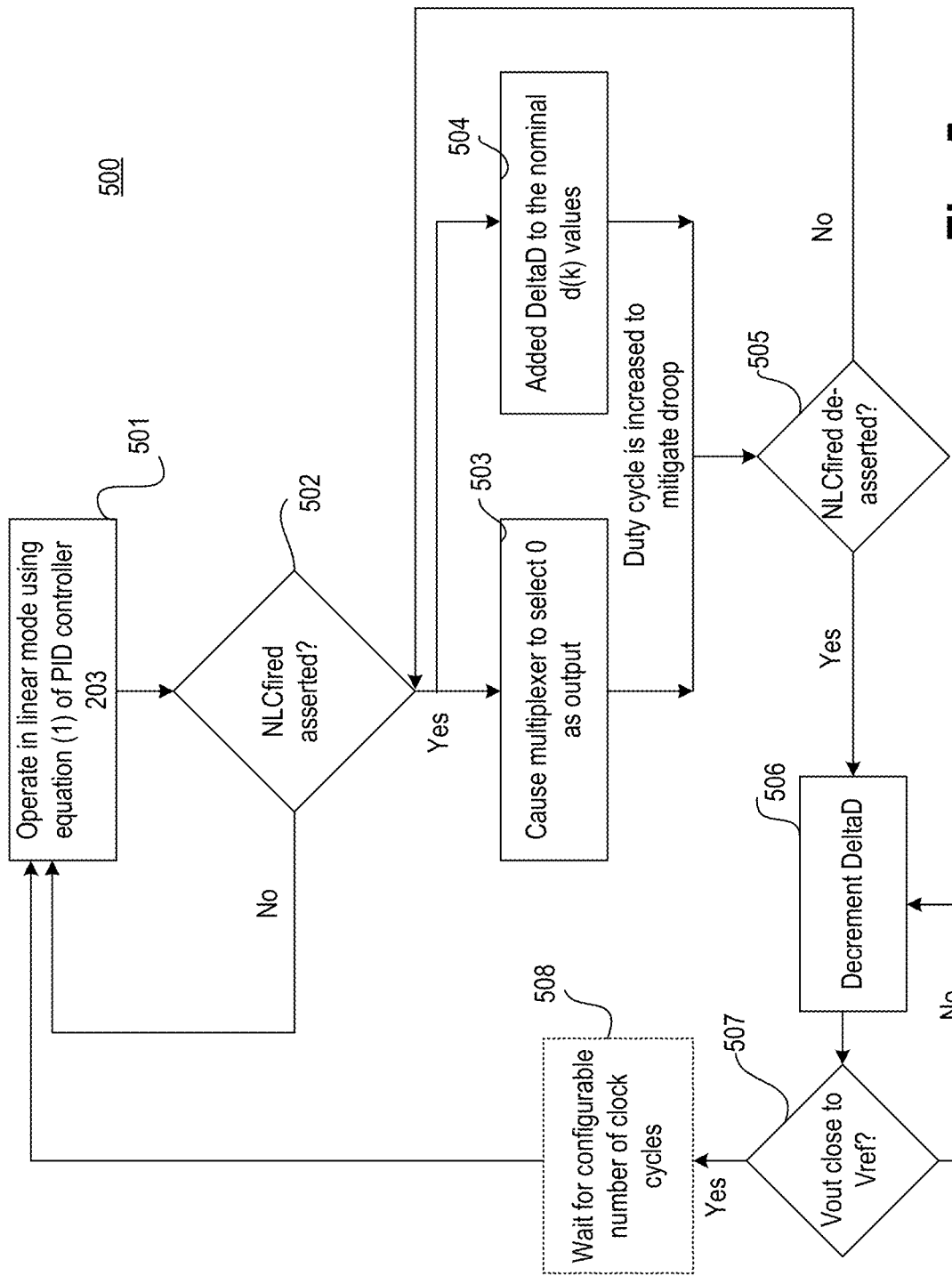
FIG. 5 illustrates a flowchart of a finite state machine (FSM) for seamless transition from non-linear control to linear regulation mode, in accordance with some embodiments.

FIG. 5 illustrates flowchart 500 implemented by a finite state machine for seamless transition from non-linear control to linear regulation mode, in accordance with some embodiments. While the blocks in flowchart 500 are shown in the particular order, the order can be modified. For example, some blocks can be performed before others, while some can be performed in parallel or simultaneously with other blocks. The various operations performed by flowchart 500 can be implemented in software, hardware, or a combination of them.

At block 501, voltage regulator 200 operates in linear mode (e.g., linear feedback mode) using equation (1) of PID controller 203. In this case, Vout (or a divided version of Vout) is compared by Vref by ADC 202 and duty cycle for pDrv and nDrv is modulated to bring Vout (or its divided version) close to or identical to Vref. This is a low bandwidth operation that adjusts Vout slowly over time to regulate it with reference to Vref (a first threshold). Upon detection of a droop, NLC logic 204 fires or asserts NLCfirst signal. NLC logic 204 fires the NLCfirst signal when the output voltage Vout falls below a second threshold (a droop threshold), wherein the second threshold is lower than the first threshold. At block 502 a determination is made whether NLCfirst signal is asserted. If NLCfirst signal is asserted, then a droop condition occurred and the duty cycle of pDrv and nDrv are to be modified to bring Vout close to or identical to Vref as quick as possible. This is a higher bandwidth control loop. In the absence of the droop, the process proceeds in low bandwidth feedback loop as indicated by block 501.

At block 503, logic 404 causes multiplexer 403 to selects 0 as its output. In this case, the error terms e[k] from ADC 202 (or comparator) are ignored or bypassed. As such, PID controller 203 implements equation (2). At block 504, DeltaD offset is added to the nominal duty cycle command terms d(k) and its previous terms d(k−1), d(k−2) and onwards. In one example, the content of register 405 that stores the DeltaD value is added to the sampled Dnom prior to the NLCfired signal going high, and is fed into the initial state of the d(k−1), d(k−2), and d(k−3) terms. The resulting d(k) is therefore equal to Dnom+DeltaD as the sum of $k_1$, $k_2$, and $k_3$ is equal to 1 which is needed for an infinite DC gain integrator. As such, the Type-III compensator 400 is handheld to output the value of the duty cycle needed while setting the integrator states correctly which will avoid any wind-up or other classical mechanisms that cause output chatter.

FSM 500 then begins the process of seamlessly moving from the high bandwidth control loop (equation 2) to the low bandwidth control loop (equation 1). At block 505, a determination is made whether NLCfired is de-asserted. If NLCfired is still asserted, the droop mitigation continues. If NLCfired is de-asserted, the process proceeds to block 506 where DeltaD is decremented. For example, DeltaD is decremented or its value reduced by a counter by one or a predetermined value. In some embodiments, DeltaD is decremented initially (e.g., 4) by a larger step (like binary search algorithm) and subsequently decremented by a smaller step (e.g., 1) when at block 507 it is determined that Vout is not close to Vref. If Vout is close to Vref, then multiplexer 403 selects the error terms to implement equation (1). In some embodiments, a timer signal is used to wait for configurable number of clock cycles (as indicated by block 508) before transitioning to the low bandwidth control loop of block 501. In some embodiments, block 508 is performed in parallel to blocks 506 and 507, and which ever one of blocks 507 of 508 reaches its goal first, that indication is used to switch multiplexer 403 to the error terms to move to the low bandwidth control loop.

The technique of various embodiments can also be used to exploit power management (PM) signals that warn an upcoming load transient. For example, the scheme can safely transition from a pre-set open loop value when a PM signal arrives to a slightly higher value after which the same state machine operation of staying there and returning back to set-point can happen. This facilitates using the inherent speed of the IVR with smaller inductors and transitioning to quicker boosted voltage values to avoid exercising the DAC in conventional and traditional VID boost mechanisms to facilitate accommodating PM signals that cannot give a heads-up before, for example, 5 ns of time.

In some embodiments, a droop arrival is estimated or predicted (e.g., by monitoring workload in an execution pipeline) and NLC 204 fires NLCfired signal (e.g., 5-10 ns before the di/dt event) and digital controller 203 then goes to a pre-programmed duty step value above its nominal voltage and allows the load transient to happen at this raised voltage level after which the voltage comes back to its original set-point. This mechanism can eliminate the need for guardbands related to droop and save overall power consumption which could be used to also enhance performance at iso power.

The technique of hand holding the integrator states and its memory (e.g., offset value) while bypassing the proportional and derivative terms can also be adopted for other digitally controlled regulators like the low dropout (LDO) regulator, digital low voltage regulator (DLVR), other switching converters like Boost, Buck-Boost, etc., linear controller like I/P or proportional-integral (PI) or PID or Type-I or Type-II or Type-III controller. The concept of hand holding the integrator states and its memory (e.g., offset value) while bypassing the proportional and derivative terms can also be adopted for PWM (pulse width modulation) to PFM (pulse frequency modulation) or Hysteretic transition in classical mode switching for efficiency, envelope tracking or any linear system that has a digital closed loop and wants to implement a mode change to include non-linear control, variable frequency control, or any other variation to boost system performance.

Figure 6:
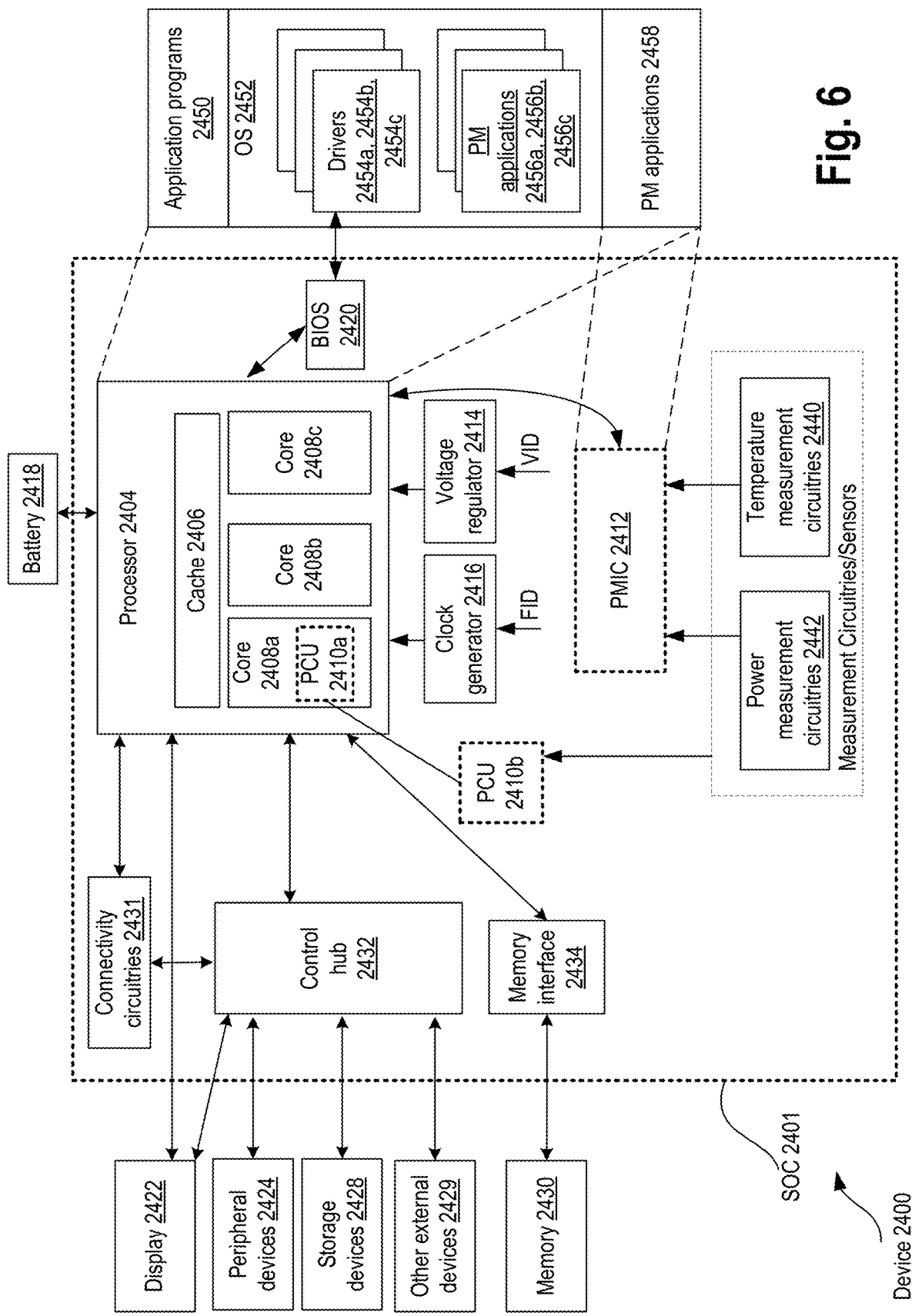
FIG. 6 illustrates a smart device or a computer system or a SoC (System-on-Chip) with voltage regulator having apparatus for seamless transition from non-linear control to linear regulation mode, in accordance with some embodiments.

FIG. 6 illustrates a smart device or a computer system or a SoC (System-on-Chip) with voltage regulator having apparatus for seamless non-linear control to linear regulation mode transition, in accordance with some embodiments, in accordance with some embodiments.

In some embodiments, device 2400 represents an appropriate computing device, such as a computing tablet, a mobile phone or smart-phone, a laptop, a desktop, an Internet-of-Things (IOT) device, a server, a wearable device, a set-top box, a wireless-enabled e-reader, or the like. It will be understood that certain components are shown generally, and not all components of such a device are shown in device 2400.

In an example, the device 2400 comprises an SoC (System-on-Chip) 2401. An example boundary of the SoC 2401 is illustrated using dotted lines in FIG. 6, with some example components being illustrated to be included within SoC 2401—however, SoC 2401 may include any appropriate components of device 2400.

In some embodiments, device 2400 includes processor 2404. Processor 2404 can include one or more physical devices, such as microprocessors, application processors, microcontrollers, programmable logic devices, processing cores, or other processing means. The processing operations performed by processor 2404 include the execution of an operating platform or operating system on which applications and/or device functions are executed. The processing operations include operations related to I/O (input/output) with a human user or with other devices, operations related to power management, operations related to connecting computing device 2400 to another device, and/or the like. The processing operations may also include operations related to audio I/O and/or display I/O.

In some embodiments, processor 2404 includes multiple processing cores (also referred to as cores) 2408a, 2408b, 2408c. Although merely three cores 2408a, 2408b, 2408c are illustrated in FIG. 6, processor 2404 may include any other appropriate number of processing cores, e.g., tens, or even hundreds of processing cores. Processor cores 2408a, 2408b, 2408c may be implemented on a single integrated circuit (IC) chip. Moreover, the chip may include one or more shared and/or private caches, buses or interconnections, graphics and/or memory controllers, or other components.

In some embodiments, processor 2404 includes cache 2406. In an example, sections of cache 2406 may be dedicated to individual cores 2408 (e.g., a first section of cache 2406 dedicated to core 2408a, a second section of cache 2406 dedicated to core 2408b, and so on). In an example, one or more sections of cache 2406 may be shared among two or more of cores 2408. Cache 2406 may be split in different levels, e.g., level 1 (L1) cache, level 2 (L2) cache, level 3 (L3) cache, etc.

In some embodiments, processor core 2404 may include a fetch unit to fetch instructions (including instructions with conditional branches) for execution by the core 2404. The instructions may be fetched from any storage devices such as the memory 2430. Processor core 2404 may also include a decode unit to decode the fetched instruction. For example, the decode unit may decode the fetched instruction into a plurality of micro-operations. Processor core 2404 may include a schedule unit to perform various operations associated with storing decoded instructions. For example, the schedule unit may hold data from the decode unit until the instructions are ready for dispatch, e.g., until all source values of a decoded instruction become available. In one embodiment, the schedule unit may schedule and/or issue (or dispatch) decoded instructions to an execution unit for execution.

The execution unit may execute the dispatched instructions after they are decoded (e.g., by the decode unit) and dispatched (e.g., by the schedule unit). In an embodiment, the execution unit may include more than one execution unit (such as an imaging computational unit, a graphics computational unit, a general-purpose computational unit, etc.). The execution unit may also perform various arithmetic operations such as addition, subtraction, multiplication, and/or division, and may include one or more an arithmetic logic units (ALUs). In an embodiment, a co-processor (not shown) may perform various arithmetic operations in conjunction with the execution unit.

Further, execution unit may execute instructions out-of-order. Hence, processor core 2404 may be an out-of-order processor core in one embodiment. Processor core 2404 may also include a retirement unit. The retirement unit may retire executed instructions after they are committed. In an embodiment, retirement of the executed instructions may result in processor state being committed from the execution of the instructions, physical registers used by the instructions being de-allocated, etc. Processor core 2404 may also include a bus unit to enable communication between components of processor core 2404 and other components via one or more buses. Processor core 2404 may also include one or more registers to store data accessed by various components of the core 2404 (such as values related to assigned app priorities and/or sub-system states (modes) association.

In some embodiments, device 2400 comprises connectivity circuitries 2431. For example, connectivity circuitries 2431 includes hardware devices (e.g., wireless and/or wired connectors and communication hardware) and/or software components (e.g., drivers, protocol stacks), e.g., to enable device 2400 to communicate with external devices. Device 2400 may be separate from the external devices, such as other computing devices, wireless access points or base stations, etc.

In an example, connectivity circuitries 2431 may include multiple different types of connectivity. To generalize, the connectivity circuitries 2431 may include cellular connectivity circuitries, wireless connectivity circuitries, etc. Cellular connectivity circuitries of connectivity circuitries 2431 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. Wireless connectivity circuitries (or wireless interface) of the connectivity circuitries 2431 refers to wireless connectivity that is not cellular, and can include personal area networks (such as Bluetooth, Near Field, etc.), local area networks (such as Wi-Fi), and/or wide area networks (such as WiMax), and/or other wireless communication. In an example, connectivity circuitries 2431 may include a network interface, such as a wired or wireless interface, e.g., so that a system embodiment may be incorporated into a wireless device, for example, a cell phone or personal digital assistant.

In some embodiments, device 2400 comprises control hub 2432, which represents hardware devices and/or software components related to interaction with one or more I/O devices. For example, processor 2404 may communicate with one or more of display 2422, one or more peripheral devices 2424, storage devices 2428, one or more other external devices 2429, etc., via control hub 2432. Control hub 2432 may be a chipset, a Platform Control Hub (PCH), and/or the like.

For example, control hub 2432 illustrates one or more connection points for additional devices that connect to device 2400, e.g., through which a user might interact with the system. For example, devices (e.g., devices 2429) that can be attached to device 2400 include microphone devices, speaker or stereo systems, audio devices, video systems or other display devices, keyboard or keypad devices, or other I/O devices for use with specific applications such as card readers or other devices.

As mentioned above, control hub 2432 can interact with audio devices, display 2422, etc. For example, input through a microphone or other audio device can provide input or commands for one or more applications or functions of device 2400. Additionally, audio output can be provided instead of, or in addition to display output. In another example, if display 2422 includes a touch screen, display 2422 also acts as an input device, which can be at least partially managed by control hub 2432. There can also be additional buttons or switches on computing device 2400 to provide I/O functions managed by control hub 2432. In one embodiment, control hub 2432 manages devices such as accelerometers, cameras, light sensors or other environmental sensors, or other hardware that can be included in device 2400. The input can be part of direct user interaction, as well as providing environmental input to the system to influence its operations (such as filtering for noise, adjusting displays for brightness detection, applying a flash for a camera, or other features).

In some embodiments, control hub 2432 may couple to various devices using any appropriate communication protocol, e.g., PCIe (Peripheral Component Interconnect Express), USB (Universal Serial Bus), Thunderbolt, High Definition Multimedia Interface (HDMI), Firewire, etc.

In some embodiments, display 2422 represents hardware (e.g., display devices) and software (e.g., drivers) components that provide a visual and/or tactile display for a user to interact with device 2400. Display 2422 may include a display interface, a display screen, and/or hardware device used to provide a display to a user. In some embodiments, display 2422 includes a touch screen (or touch pad) device that provides both output and input to a user. In an example, display 2422 may communicate directly with the processor 2404. Display 2422 can be one or more of an internal display device, as in a mobile electronic device or a laptop device or an external display device attached via a display interface (e.g., DisplayPort, etc.). In one embodiment display 2422 can be a head mounted display (HMD) such as a stereoscopic display device for use in virtual reality (VR) applications or augmented reality (AR) applications.

In some embodiments, and although not illustrated in the figure, in addition to (or instead of) processor 2404, device 2400 may include Graphics Processing Unit (GPU) comprising one or more graphics processing cores, which may control one or more aspects of displaying contents on display 2422.

Control hub 2432 (or platform controller hub) may include hardware interfaces and connectors, as well as software components (e.g., drivers, protocol stacks) to make peripheral connections, e.g., to peripheral devices 2424.

It will be understood that device 2400 could both be a peripheral device to other computing devices, as well as have peripheral devices connected to it. Device 2400 may have a "docking" connector to connect to other computing devices for purposes such as managing (e.g., downloading and/or uploading, changing, synchronizing) content on device 2400. Additionally, a docking connector can allow device 2400 to connect to certain peripherals that allow computing device 2400 to control content output, for example, to audiovisual or other systems.

In addition to a proprietary docking connector or other proprietary connection hardware, device 2400 can make peripheral connections via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, connectivity circuitries 2431 may be coupled to control hub 2432, e.g., in addition to, or instead of, being coupled directly to the processor 2404. In some embodiments, display 2422 may be coupled to control hub 2432, e.g., in addition to, or instead of, being coupled directly to processor 2404.

In some embodiments, device 2400 comprises memory 2430 coupled to processor 2404 via memory interface 2434. Memory 2430 includes memory devices for storing information in device 2400.

In some embodiments, memory 2430 includes apparatus to maintain stable clocking as described with reference to various embodiments. Memory can include nonvolatile (state does not change if power to the memory device is interrupted) and/or volatile (state is indeterminate if power to the memory device is interrupted) memory devices. Memory device 2430 can be a dynamic random-access memory (DRAM) device, a static random-access memory (SRAM) device, flash memory device, phase-change memory device, or some other memory device having suitable performance to serve as process memory. In one embodiment, memory 2430 can operate as system memory for device 2400, to store data and instructions for use when the one or more processors 2404 executes an application or process. Memory 2430 can store application data, user data, music, photos, documents, or other data, as well as system data (whether long-term or temporary) related to the execution of the applications and functions of device 2400.

Elements of various embodiments and examples are also provided as a machine-readable medium (e.g., memory 2430) for storing the computer-executable instructions (e.g., instructions to implement any other processes discussed herein). The machine-readable medium (e.g., memory 2430) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, device 2400 comprises temperature measurement circuitries 2440, e.g., for measuring temperature of various components of device 2400. In an example, temperature measurement circuitries 2440 may be embedded, or coupled or attached to various components, whose temperature are to be measured and monitored. For example, temperature measurement circuitries 2440 may measure temperature of (or within) one or more cores 2408a, 2408b, 2408c, voltage regulator 2414, memory 2430, a mother-board of SoC 2401, and/or any appropriate component of device 2400.

In some embodiments, device 2400 comprises power measurement circuitries 2442, e.g., for measuring power consumed by one or more components of the device 2400. In an example, in addition to, or instead of, measuring power, the power measurement circuitries 2442 may measure voltage and/or current. In an example, the power measurement circuitries 2442 may be embedded, or coupled or attached to various components, whose power, voltage, and/or current consumption are to be measured and monitored. For example, power measurement circuitries 2442 may measure power, current and/or voltage supplied by one or more voltage regulators 2414, power supplied to SoC 2401, power supplied to device 2400, power consumed by processor 2404 (or any other component) of device 2400, etc.

In some embodiments, device 2400 comprises one or more voltage regulator circuitries, generally referred to as voltage regulator (VR) 2414. VR 2414 generates signals at appropriate voltage levels, which may be supplied to operate any appropriate components of the device 2400. Merely as an example, VR 2414 is illustrated to be supplying signals to processor 2404 of device 2400. In some embodiments, VR 2414 receives one or more Voltage Identification (VID) signals, and generates the voltage signal at an appropriate level, based on the VID signals. Various type of VRs may be utilized for the VR 2414. For example, VR 2414 may include a "buck" VR, "boost" VR, a combination of buck and boost VRs, low dropout (LDO) regulators, switching DC-DC regulators, constant-on-time controller-based DC-DC regulator, etc. Buck VR is generally used in power delivery applications in which an input voltage needs to be transformed to an output voltage in a ratio that is smaller than unity. Boost VR is generally used in power delivery applications in which an input voltage needs to be transformed to an output voltage in a ratio that is larger than unity. In some embodiments, each processor core has its own VR, which is controlled by PCU 2410a/b and/or PMIC 2412. In some embodiments, each core has a network of distributed LDOs to provide efficient control for power management. The LDOs can be digital, analog, or a combination of digital or analog LDOs. In some embodiments, VR 2414 includes current tracking apparatus to measure current through power supply rail(s).

In some embodiments, VR 2414 includes a digital control scheme to manage states of a proportional-integral-derivative (PID) filter (also known as a digital Type-III compensator). The digital control scheme controls the integrator of the PID filter to implement non-linear control of saturating the duty cycle during which the proportional and derivative terms of the PID are set to 0 while the integrator and its internal states (previous values or memory) is set to a duty cycle that is the sum of the current nominal duty cycle plus a deltaD. The deltaD is the maximum duty cycle increment that is used to regulate a voltage regulator from ICCmin to ICCmax and is a configuration register that can be set post silicon. A state machine moves from a non-linear all ON state (which brings the output voltage Vout back to a regulation window) to an open loop duty cycle which maintains the output voltage slightly higher than the required reference voltage Vref. After a certain period in this state of open loop at the commanded duty cycle, the state machine then ramps down the open loop duty cycle value until the output voltage is close to the Vref commanded. As such, output chatter on the output supply from VR 2414 is completely eliminated (or substantially eliminated) and there is merely a single undershoot transition which could lead to a guaranteed Vmin based on a comparator delay and the di/dt of the load with the available output decoupling capacitance.

In some embodiments, device 2400 comprises one or more clock generator circuitries, generally referred to as clock generator 2416. Clock generator 2416 generates clock signals at appropriate frequency levels, which may be supplied to any appropriate components of device 2400. Merely as an example, clock generator 2416 is illustrated to be supplying clock signals to processor 2404 of device 2400. In some embodiments, clock generator 2416 receives one or more Frequency Identification (FID) signals, and generates the clock signals at an appropriate frequency, based on the FID signals.

In some embodiments, device 2400 comprises battery 2418 supplying power to various components of device 2400. Merely as an example, battery 2418 is illustrated to be supplying power to processor 2404. Although not illustrated in the figures, device 2400 may comprise a charging circuitry, e.g., to recharge the battery, based on Alternating Current (AC) power supply received from an AC adapter.

In some embodiments, device 2400 comprises Power Control Unit (PCU) 2410 (also referred to as Power Management Unit (PMU), Power Controller, etc.). In an example, some sections of PCU 2410 may be implemented by one or more processing cores 2408, and these sections of PCU 2410 are symbolically illustrated using a dotted box and labelled PCU 2410*a*. In an example, some other sections of PCU 2410 may be implemented outside the processing cores 2408, and these sections of PCU 2410 are symbolically illustrated using a dotted box and labelled as PCU 2410*b*. PCU 2410 may implement various power management operations for device 2400. PCU 2410 may include hardware interfaces, hardware circuitries, connectors, registers, etc., as well as software components (e.g., drivers, protocol stacks), to implement various power management operations for device 2400.

In some embodiments, device 2400 comprises Power Management Integrated Circuit (PMIC) 2412, e.g., to implement various power management operations for device 2400. In some embodiments, PMIC 2412 is a Reconfigurable Power Management ICs (RPMICs) and/or an IMVP (Intel® Mobile Voltage Positioning). In an example, the PMIC is within an IC chip separate from processor 2404. The may implement various power management operations for device 2400. PMIC 2412 may include hardware interfaces, hardware circuitries, connectors, registers, etc., as well as software components (e.g., drivers, protocol stacks), to implement various power management operations for device 2400.

In an example, device 2400 comprises one or both PCU 2410 or PMIC 2412. In an example, any one of PCU 2410 or PMIC 2412 may be absent in device 2400, and hence, these components are illustrated using dotted lines.

Various power management operations of device 2400 may be performed by PCU 2410, by PMIC 2412, or by a combination of PCU 2410 and PMIC 2412. For example, PCU 2410 and/or PMIC 2412 may select a power state (e.g., P-state) for various components of device 2400. For example, PCU 2410 and/or PMIC 2412 may select a power state (e.g., in accordance with the ACPI (Advanced Configuration and Power Interface) specification) for various components of device 2400. Merely as an example, PCU 2410 and/or PMIC 2412 may cause various components of the device 2400 to transition to a sleep state, to an active state, to an appropriate C state (e.g., C0 state, or another appropriate C state, in accordance with the ACPI specification), etc. In an example, PCU 2410 and/or PMIC 2412 may control a voltage output by VR 2414 and/or a frequency of a clock signal output by the clock generator, e.g., by outputting the VID signal and/or the FID signal, respectively. In an example, PCU 2410 and/or PMIC 2412 may control battery power usage, charging of battery 2418, and features related to power saving operation.

The clock generator 2416 can comprise a phase locked loop (PLL), frequency locked loop (FLL), or any suitable clock source. In some embodiments, each core of processor 2404 has its own clock source. As such, each core can operate at a frequency independent of the frequency of operation of the other core. In some embodiments, PCU 2410 and/or PMIC 2412 performs adaptive or dynamic frequency scaling or adjustment. For example, clock frequency of a processor core can be increased if the core is not operating at its maximum power consumption threshold or limit. In some embodiments, PCU 2410 and/or PMIC 2412 determines the operating condition of each core of a processor, and opportunistically adjusts frequency and/or power supply voltage of that core without the core clocking source (e.g., PLL of that core) losing lock when the PCU 2410 and/or PMIC 2412 determines that the core is operating below a target performance level. For example, if a core is drawing current from a power supply rail less than a total current allocated for that core or processor 2404, then PCU 2410 and/or PMIC 2412 can temporality increase the power draw for that core or processor 2404 (e.g., by increasing clock frequency and/or power supply voltage level) so that the core or processor 2404 can perform at higher performance level. As such, voltage and/or frequency can be increased temporality for processor 2404 without violating product reliability.

In an example, PCU 2410 and/or PMIC 2412 may perform power management operations, e.g., based at least in part on receiving measurements from power measurement circuitries 2442, temperature measurement circuitries 2440, charge level of battery 2418, and/or any other appropriate information that may be used for power management. To that end, PMIC 2412 is communicatively coupled to one or more sensors to sense/detect various values/variations in one or more factors having an effect on power/thermal behavior of the system/platform. Examples of the one or more factors include electrical current, voltage droop, temperature, operating frequency, operating voltage, power consumption, inter-core communication activity, etc. One or more of these sensors may be provided in physical proximity (and/or thermal contact/coupling) with one or more components or logic/IP blocks of a computing system. Additionally, sensor(s) may be directly coupled to PCU 2410 and/or PMIC 2412 in at least one embodiment to allow PCU 2410 and/or PMIC 2412 to manage processor core energy at least in part based on value(s) detected by one or more of the sensors.

Also illustrated is an example software stack of device 2400 (although not all elements of the software stack are illustrated). Merely as an example, processors 2404 may execute application programs 2450, Operating System 2452, one or more Power Management (PM) specific application programs (e.g., generically referred to as PM applications 2458), and/or the like. PM applications 2458 may also be executed by the PCU 2410 and/or PMIC 2412. OS 2452 may also include one or more PM applications 2456*a*, 2456*b*, 2456*c*. The OS 2452 may also include various drivers 2454*a*, 2454*b*, 2454*c*, etc., some of which may be specific for power management purposes. In some embodiments, device 2400 may further comprise a Basic Input/output System (BIOS) 2420. BIOS 2420 may communicate with OS 2452 (e.g., via one or more drivers 2454), communicate with processors 2404, etc.

For example, one or more of PM applications 2458, 2456, drivers 2454, BIOS 2420, etc. may be used to implement power management specific tasks, e.g., to control voltage and/or frequency of various components of device 2400, to control wake-up state, sleep state, and/or any other appropriate power state of various components of device 2400, control battery power usage, charging of the battery 2418, features related to power saving operation, etc.

In some embodiments, battery 2418 is a Li-metal battery with a pressure chamber to allow uniform pressure on a battery. The pressure chamber is supported by metal plates (such as pressure equalization plate) used to give uniform pressure to the battery. The pressure chamber may include pressured gas, elastic material, spring plate, etc. The outer skin of the pressure chamber is free to bow, restrained at its edges by (metal) skin, but still exerts a uniform pressure on the plate that is compressing the battery cell. The pressure chamber gives uniform pressure to battery, which is used to enable high-energy density battery with, for example, 20% more battery life.

In some embodiments, pCode executing on PCU 2410*a/b* has a capability to enable extra compute and telemetries resources for the runtime support of the pCode. Here pCode refers to a firmware executed by PCU 2410*a/b* to manage performance of the 2401. For example, pCode may set frequencies and appropriate voltages for the processor. Part of the pCode are accessible via OS 2452. In various embodiments, mechanisms and methods are provided that dynamically change an Energy Performance Preference (EPP) value based on workloads, user behavior, and/or system conditions. There may be a well-defined interface between OS 2452 and the pCode. The interface may allow or facilitate the software configuration of several parameters and/or may provide hints to the pCode. As an example, an EPP parameter may inform a pCode algorithm as to whether performance or battery life is more important.

This support may be done as well by the OS 2452 by including machine-learning support as part of OS 2452 and either tuning the EPP value that the OS hints to the hardware (e.g., various components of SCO 2401) by machine-learning prediction, or by delivering the machine-learning prediction to the pCode in a manner similar to that done by a Dynamic Tuning Technology (DTT) driver. In this model, OS 2452 may have visibility to the same set of telemetries as are available to a DTT. As a result of a DTT machine-learning hint setting, pCode may tune its internal algorithms to achieve optimal power and performance results following the machine-learning prediction of activation type. The pCode as example may increase the responsibility for the processor utilization change to enable fast response for user activity, or may increase the bias for energy saving either by reducing the responsibility for the processor utilization or by saving more power and increasing the performance lost by tuning the energy saving optimization. This approach may facilitate saving more battery life in case the types of activities enabled lose some performance level over what the system can enable. The pCode may include an algorithm for dynamic EPP that may take the two inputs, one from OS 2452 and the other from software such as DTT, and may selectively choose to provide higher performance and/or responsiveness. As part of this method, the pCode may enable in the DTT an option to tune its reaction for the DTT for different types of activity.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional elements.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process. The examples can be combined in any combinations. For example, example 4 can be combined with example 2.

Example 1: An apparatus comprising: an analog-to-digital converter to convert an analog voltage to a digital representation indicative of an error between the analog voltage and a threshold voltage; and a digital filter to receive the digital representation and to generate a duty cycle command, wherein the duty cycle command is to instruct a controller to adjust a duty cycle of a signal which is used to adjust the analog voltage, wherein the digital filter comprises a feedforward path and an integral path, wherein the feedforward path is coupled to the integral path via a multiplexer.

Example 2: The apparatus of example 1, wherein the threshold is a first threshold, wherein the multiplexer is to bypass the feedforward path when the analog voltage crosses a second threshold, wherein the second threshold is indicative of a voltage droop in the analog voltage.

Example 3: The apparatus of example 2 comprises a register to store an offset to be added to the duty cycle command, wherein the offset is added to the duty cycle before the analog voltage crosses the second threshold.

Example 4: The apparatus of example 2, wherein the second threshold is lower than the first threshold.

Example 5: The apparatus of example 3 comprises a counter to lower the offset as the error between the analog voltage and the first threshold reduces.

Example 6: The apparatus of example 5 comprises logic to allow an output of the feedforward path to pass through the multiplexer to the integral path when the offset is close to zero.

Example 7: The apparatus of example 5 comprises logic to allow an output of the feedforward path to pass through the multiplexer to the integral path when the error between the analog voltage and the first threshold is substantially zero.

Example 8: The apparatus of example 1 comprises an inductor coupled the analog-to-digital converter.

Example 9: The apparatus of example 1 comprises a bridge having a high-side switch and a low-side switch, wherein the high-side switch and the low-side switch are controllable by first signal and a second signal, wherein the first and second signals have a duty cycle adjusted according to the duty cycle command.

Example 10: A voltage regulator comprising: a low bandwidth feedback path to control regulation of an output supply voltage relative to a first reference voltage during a steady state; a high bandwidth feedback path to control regulation of the output supply voltage when the output supply voltage crosses a second threshold, wherein the second threshold is lower than the first threshold; and a controller to facilitate transition from the high bandwidth feedback path to the low bandwidth feedback path via a multiplexer to bypass a feedforward path of the controller.

Example 11: The voltage regulator of example 10, wherein the controller is a first controller, wherein the controller is to receive a digital representation of an error between the output supply voltage and the first reference, and to generate a duty cycle command, wherein the duty cycle command is to instruct a second controller to adjust a duty cycle of a signal which is used to adjust the output supply voltage.

Example 12: The voltage regulator of example 11 comprises a register to store an offset to be added to the duty cycle command, wherein the offset is added to the duty cycle before the output supply voltage crosses the second threshold.

Example 13: The voltage regulator of example 12 comprises a counter to lower the offset as the error between the output supply voltage and the first threshold reduces.

Example 14: The voltage regulator of example 13 comprises logic to allow an output of the feedforward path to pass through the multiplexer to an integral path of the first controller when the offset is close to zero.

Example 15: The voltage regulator of example 13 comprises logic to allow an output of the feedforward path to pass through the multiplexer to an integral path of the first controller when the error between the output supply voltage and the first threshold is substantially zero.

Example 16: The voltage regulator of example 11 wherein the low bandwidth feedback path and the high bandwidth feedback path comprise a bridge having a high-side switch and a low-side switch, wherein the high-side switch and the low-side switch are controllable by a first signal and a second signal, wherein the first and second signals have a duty cycle adjusted according to the duty cycle command.

Example 17: A system comprising: a memory; a processor coupled to the memory; and a wireless interface to allow the processor to communicate with another device, wherein the processor includes a voltage regulator comprising: a low bandwidth feedback path to control regulation of an output supply voltage relative to a first reference voltage during a steady state; a high bandwidth feedback path to control regulation of the output supply voltage when the output supply voltage crosses a second threshold, wherein the second threshold is lower than the first threshold; and a controller to facilitate transition from the high bandwidth feedback path to the low bandwidth feedback path via a multiplexer to bypass a feedforward path of the controller.

Example 18: The system of example 17, wherein the controller is a first controller, wherein the controller is to receive a digital representation of an error between the output supply voltage and the first reference, and to generate a duty cycle command, wherein the duty cycle command is to instruct a second controller to adjust a duty cycle of a signal which is used to adjust the output supply voltage.

Example 19: The system of example 18, wherein the processor comprises: a register to store an offset to be added to the duty cycle command, wherein the offset is added to the duty cycle before the output supply voltage crosses the second threshold; a counter to lower the offset as the error between the output supply voltage and the first threshold reduces; and logic to allow an output of the feedforward path to pass through the multiplexer to an integral path of the first controller when the offset is close to zero.

Example 20: The system of example 18 wherein the low bandwidth feedback path and the high bandwidth feedback path comprise a bridge having a high-side switch and a low-side switch, wherein the high-side switch and the low-side switch are controllable by a first signal and a second signal, wherein the first and second signals have a duty cycle adjusted according to the duty cycle command.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An apparatus, comprising:
   an analog-to-digital converter to convert an analog voltage to a digital representation indicative of an error between the analog voltage and a reference voltage;
   a digital filter to receive the digital representation and to generate a duty cycle command, wherein the duty cycle command is to instruct a controller to adjust a duty cycle of a signal which is used to adjust the analog voltage, and the digital filter comprises a feedforward path and an integral path; and
   a multiplexer to couple the feedforward path to the integral path when the analog voltage is above a droop threshold which is less than the reference voltage, and to bypass the feedforward path when the analog voltage is below the droop threshold, wherein to bypass the feedforward path, the multiplexer is to pass a 0 to the integral path in place of an output of the feedforward path.

2. The apparatus of claim 1, wherein the multiplexer is to pass the output of the feedforward path to an input of the integral path when the analog voltage is above the droop threshold.

3. The apparatus of claim 1, further comprising a register to store an offset to be added to the duty cycle command, wherein the offset is added to the duty cycle when the analog voltage crosses below the droop threshold, before asserting a signal indicating the analog voltage has crossed below the droop threshold.

4. The apparatus of claim 3, further comprising a counter to lower the offset as the error between the analog voltage and the reference voltage reduces.

5. The apparatus of claim 4, further comprising logic to allow the output of the feedforward path to pass through the multiplexer to the integral path when the offset is close to zero.

6. The apparatus of claim 4, further comprising logic to allow the output of the feedforward path to pass through the multiplexer to the integral path when the error between the analog voltage and the reference voltage is substantially zero.

7. The apparatus of claim 1, further comprising an inductor coupled the analog-to-digital converter.

8. The apparatus of claim 1, further comprising a bridge having a high-side switch and a low-side switch, wherein the high-side switch and the low-side switch are controllable by first and second signals having the duty cycle adjusted according to the duty cycle command.

9. A voltage regulator, comprising:
a powertrain to output a supply voltage; and
circuitry to regulate the supply voltage, wherein:
the circuitry is to regulate the supply voltage relative to a reference voltage with a low bandwidth control loop when the supply voltage does not drop below a droop threshold, and relative to a voltage higher than the reference voltage with a high bandwidth control loop when the supply voltage drops below the droop threshold;
the droop threshold is lower than the reference voltage; and
the high bandwidth control loop has a higher bandwidth than the low bandwidth control loop; wherein:
the circuitry comprises a first controller to receive a digital representation of an error between the supply voltage and the reference voltage, and to generate a duty cycle command;
the duty cycle command is to instruct a second controller to adjust a duty cycle of a signal which is used to adjust the supply voltage;
the circuitry comprises a register to store an offset to be added to the duty cycle command; and
the offset is added to the duty cycle when the supply voltage drops below the droop threshold, before the circuitry is to assert a signal indicating the supply voltage crosses below the droop threshold.

10. The voltage regulator of claim 9, further comprising a counter to lower the offset as the error between the supply voltage and the reference voltage reduces.

11. The voltage regulator of claim 10, wherein the first controller comprises a feedforward path followed by an integral path, and a multiplexer between the feedforward path and the integral path, and the voltage regulator further comprises logic to allow an output of the feedforward path to pass through the multiplexer to the integral path when the offset is close to zero.

12. The voltage regulator of claim 10, wherein the first controller comprises a feedforward path followed by an integral path, and a multiplexer between the feedforward path and the integral path, and the voltage regulator further comprises logic to allow an output of the feedforward path to pass through the multiplexer to the integral path of the first controller when the error between the supply voltage and the reference voltage is substantially zero.

13. The voltage regulator of claim 9, wherein the circuitry comprises a bridge having a high-side switch and a low-side switch, the high-side switch and the low-side switch are controllable by a first signal and a second signal, and the first and second signals have the duty cycle adjusted according to the duty cycle command.

14. The voltage regulator of claim 9, wherein:
the circuitry is to facilitate a transition from the high bandwidth control loop to the low bandwidth control loop when the supply voltage is close, within a specified margin, of the reference voltage; and
to facilitate the transition, the circuitry is to implement a timer to wait for a configurable number of clock cycles before transitioning to the low bandwidth control loop.

15. A system, comprising:
a memory to store instructions; and
a processor coupled to the memory, wherein the processor is to execute the instructions to:
during a steady state mode, regulate an output supply voltage relative to a reference voltage in a feedforward path followed by an integral path; and
during a droop mitigation mode, when the output supply voltage crosses a droop threshold, lower than the reference voltage, regulate the output supply voltage in the integral path and bypass the feedforward path;
wherein to regulate the output supply voltage, the processor is to execute the instructions to receive a digital representation of an error between the output supply voltage and the reference voltage, and to generate a duty cycle command, wherein the duty cycle command is to adjust a duty cycle of a signal which is used to adjust the output supply voltage, and add an offset to the duty cycle command when the output supply voltage crosses below the droop threshold, before asserting a signal indicating the output supply voltage crosses below the droop threshold.

16. The system of claim 15, wherein in the droop mitigation mode, the processor is to execute the instructions to lower the offset as the error between the output supply voltage and the reference voltage reduces.

17. The system of claim 15, wherein to control a bridge having a high-side switch and a low-side switch, the processor is to execute the instructions to provide first and second signals having the duty cycle adjusted according to the duty cycle command.

18. The system of claim 16, wherein in the droop mitigation mode, the processor is to execute the instructions to provide an output of the feedforward path to the integral path when the offset is close to zero.

19. The system of claim 15, wherein:
to transition from the steady state mode to the droop mitigation mode, the processor is to execute the instructions to cause a multiplexer to provide a 0 to an input of the integral path in place of an output of the feedforward path; and to transition from the droop mitigation mode to the steady state mode, the processor is to execute the instructions to cause the multiplexer to provide the output of the feedforward path to the input of the integral path.

20. The system of claim 15, wherein a control loop bandwidth of the droop mitigation mode is higher than a control loop bandwidth of the steady state mode.

* * * * *